United States Patent [19]

Yamamoto et al.

[11] Patent Number: 4,849,803
[45] Date of Patent: Jul. 18, 1989

[54] MOLDED RESIN SEMICONDUCTOR DEVICE

[75] Inventors: Takeshi Yamamoto; Masanori Nakatsuka, both of Itami, Japan

[73] Assignee: Mitsubishi Denki Kabushiki Kaisha, Tokyo, Japan

[21] Appl. No.: 602,573

[22] Filed: Apr. 20, 1984

[30] Foreign Application Priority Data

Apr. 25, 1983 [JP] Japan .................. 58-74283

[51] Int. Cl.$^4$ .................. H01L 23/28; H01L 23/30
[52] U.S. Cl. ............................................. 357/72
[58] Field of Search ................................. 357/72

[56] References Cited

U.S. PATENT DOCUMENTS

| | | |
|---|---|---|
| 3,496,427 | 2/1970 | Lee et al. ............... 357/72 |
| 3,686,542 | 8/1972 | Dinder et al. .......... 357/72 |
| 3,939,488 | 2/1976 | Wakashima et al. ... 357/72 |
| 4,001,863 | 1/1977 | Kobayashi et al. .... 357/72 |
| 4,039,904 | 8/1977 | Klein et al. ............. 357/72 |
| 4,092,487 | 5/1978 | Imai ....................... 357/22 |
| 4,153,910 | 5/1979 | Itoh et al. ............... 357/72 |
| 4,179,725 | 12/1979 | Maguire ................. 357/72 |

FOREIGN PATENT DOCUMENTS

| | | |
|---|---|---|
| 2048067 | 4/1971 | Fed. Rep. of Germany . |
| 2048068 | 4/1971 | Fed. Rep. of Germany . |
| 2140071 | 2/1972 | Fed. Rep. of Germany . |
| 2164100 | 6/1973 | Fed. Rep. of Germany . |
| 2349545 | 4/1974 | Fed. Rep. of Germany . |
| 2347049 | 2/1975 | Fed. Rep. of Germany . |
| 2265274 | 4/1977 | Fed. Rep. of Germany . |
| 2840514 | 3/1979 | Fed. Rep. of Germany . |
| 2922005 | 12/1980 | Fed. Rep. of Germany . |
| 3128457 | 4/1982 | Fed. Rep. of Germany . |

*Primary Examiner*—Rolf Hille
*Assistant Examiner*—S. V. Clark
*Attorney, Agent, or Firm*—Sughrue, Mion, Zinn, Macpeak and Seas

[57] ABSTRACT

Diode chips 5, 6 soldered to a terminal plate 4 within a housing 1, 2 are surrounded by a low thermal expansion, high thermal conductivity thermosetting resin 13, 14, in turn covered by a flexible resin 9 having high expansion and low conductivity coefficients, in turn covered by another thermosetting resin 12. Elastic lead wires 7, 8 soldered to the diodes and embedded in the flexible resin are extended through the top resin layer by further terminal plates 10, 11. Such construction enhances heat dissipation and reduces thermal stress concentrations to thereby avoid fatigue failure in the solder connections.

7 Claims, 1 Drawing Sheet

MOLDED RESIN SEMICONDUCTOR DEVICE

BACKGROUND OF THE INVENTION

This invention relates to a molded resin semiconductor device having a plurality of semiconductor chips mounted in a single case and resin encapsulated.

Recently, semiconductor power modules of this type have become popular and their markets are rapidly expanding. The chips in such modules are connected in a double-arm configuration, a double-star configuration, a bridge configuration and the like.

Semiconductor power modules have the advantages that a plurality of them can be mounted on a single heat radiation fin together with other electrical elements, and they are convenient to use. However, stresses from thermal expansion and contraction due to the heat generated at the surfaces of the plural chips potted in thermosetting epoxy resin are greater than the stresses in conventional molded resin semiconductor elements having just a single chip.

Strain occurs at the points of contact between the resin and the copper leads or radiation plate due to the difference between the coefficients of thermal expansion of the resin and the metal, and the stress generated thereby is concentrated on those chips which have the weakest mechanical strength, which leads to damage.

To solve this problem the structure shown in FIG. 1 has been proposed, wherein a case 2 which may, for example, be rectangular, has one end mounted on the upper surface of a radiation base plate 1 of copper. An insulating plate 3 is fixed to the surface of the plate 1. A first L-shaped terminal plate 4 has a vertical portion 4a and a horizontal portion 4b fixed to the insulating plate 3.

First and second semiconducting chips 5, 6 which function as diodes or thyristors are fixed on the horizontal portion 4b, which connects one electrode of each chip to the first terminal plate 4. One end of first and second lead wires 7, 8 is connected to the other electrode of the first and second chips 5, 6. The lead wires 7, 8 are elastic copper ribbons.

A first flexible resin 9 such as gelled silicone or the like injected into the case 2 covers the insulating plate 3, the horizontal portion 4b of the first terminal plate, the chips 5, 6, and the lead wires 7, 8. The vertical portion 4a of the terminal plate 4 projects out from the first resin 9, and both upper ends of the lead wires 7, 8 are exposed at the surface thereof. Second and third terminal plates 10, 11 are connected to the exposed ends of the lead wires 7, 8.

A second thermosetting resin 12 such as epoxy or the like is applied over the first resin 9 in the case 2, with the other ends of the first, second and third terminal plates 4, 10, and 11 projecting outwardly therefrom.

When the device is operating, current intermittently flowing through the semiconductor chips 5, 6 causes strain in the base plate 1 and the second resin 12 resulting from the differences in their coefficients of thermal expansion. The stress generated by this strain is isolated from the chips 5, 6 by the flexibility of the first encapsulating resin 9 and its disposition between the plate 1 and the resin 12. The flexibility of the resin 9 also complements the elasticity of the lead wires 7, 8 since any stress applied to or generated by such wires is effectively isolated from the semiconductor chips.

Molded semiconductor devices like the one shown in FIG. 1 are disadvantageous, however, in that the coefficient of thermal expansion of the gelled silicone resin 9 is greater than that of the epoxy resin 12, and the thermal conductivity of the gelled silicone is comparatively small. Therefore, when intermittent current flows through the chips the heat generated thereby will flow through the base plate 1, the terminal plate 4, and the insulating plate 3, but very little flows through the resin 9 due to its lower thermal conductivity. As a result, the circumferences of the chips become hotter than the resin 9 near its interface with the resin 12, and the difference in thermal expansion becomes greater between the chips and the resin 9 near the chips and than between the resin 9 and the resin 12 near their interface.

The circumferences of the chips and the lead wires 7, 8 are thus exposed to stress due to such differences in thermal expansion, which fatigues the solder connecting the chips with the terminal plate 4 and the lead wires. As a result, such molded semiconductor devices do not consistently maintain their operating characteristics over a long period of time.

SUMMARY OF THE INVENTION

It is an object of the present invention to provide a molded resin semiconductor device having a plurality of semiconductor chips which are not influenced by the strain resulting from thermal expansion, and which consistently maintain their characteristics over prolonged usage.

This object is accomplished by covering the exposed surfaces of the semiconductor chips with a thermosetting resin having a relatively low coefficient of thermal expansion and a high coefficient of thermal conductivity.

DETAILED DESCRIPTION OF THE PREFERRED EMBODIMENT

Figure 1:
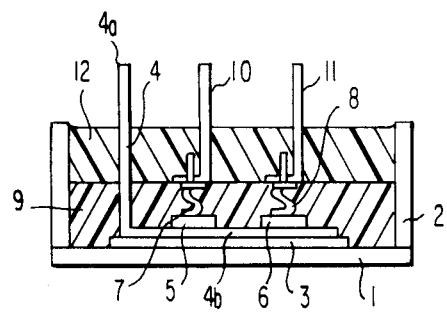
FIG. 1 is a cross-sectional view of a conventional molded resin semiconductor device having a plurality of semiconductor chips.
Figure 2:
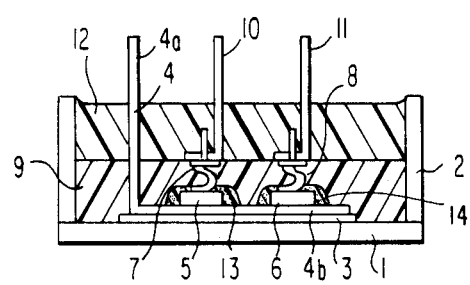
FIG. 2 is a cross-sectional view of a molded resin semiconductor device having a plurality of semiconductor chips in accordance with the present invention.

The device according to the invention as shown in FIG. 2 is very similar to the conventional device of FIG. 1, whereby only the differences between the two and several particular features will be described in detail.

The case 2 may be made of polybutylene-terephthalate and the insulating plate 3 may be made of a ceramic composition including 96% of $Al_2O_3$.

The cathode electrode of each semiconductor chip may be connected to the first terminal plate 4, and the anode electrodes thereof connected to the lead wires 7, 8.

The first flexible resin 9 is gelled silicone. One example of such gelled silicone is KE 104 (a product of SHI-NETSU) having a thermal expansion coefficient of $3.0 \times 10^{-3}/°$ C. and a thermal conductivity of $3.5 \times 10^{-4}$ cal/cm·sec·° C.

Thermosetting resin 13, 14 having a small coefficient of thermal expansion and high thermal conductivity is applied over and seals the circumferences and upper surfaces of the first and second semiconductor chips 5, 6. One example of such thermosetting resin 13, 14 is epoxy resin consisting of a main component of PER- NOX ME-266 and a curing agent of PERCURE HV-107 (a product of NIPPON PERNOX) having a thermal expansion coefficient of $2.2 \times 10^{-5}/°$ C. and a thermal conductivity of $1.24 \times 10^{-3}$ cal/cm·sec·° C. Another example of a suitable thermosetting epoxy resin consists of a main component of XN1184 (a product of NAGASE CHIBA) and a curing agent of XN1185, whose thermal expansion coefficient is $2.2 \times 10^{-5}/°$ C. and whose thermal conductivity is $1.22 \times 10^{-3}$ cal/cm·sec·° C.

The thermal expansion coefficient of the resin 13, 14 is smaller than that of the first resin 9, and the thermal conductivity of the resin 13, 14 is greater than that of the first resin 9. The second thermosetting epoxy resin 12 may be identical to the thermosetting resin 13, 14.

In operation, the heat generated by the intermittent current flowing through the semiconductor chips 5, 6 dissipates through the horizontal portion of the first terminal 4, the insulating plate 3, and the base plate 1, as before. According to the invention, however, the generated heat is also conducted outwardly through the thermosetting resin 13, 14 due to its high thermal conductivity, which prevents the heat from becoming concentrated around the circumferences and upper surfaces of the semiconductor chips. Further, as the thermal capacity of the semiconductor chips 5, 6 and the thermosetting resin 13, 14 together is greater than the thermal capacity of the chips alone, the surface temperature of the chips is less than in the device of FIG. 1.

As the thermal expansion coefficient of the resin 13, 14 is smaller than that of the resin 9, the strain exerted between the chips and the surrounding resin is also smaller. As a result, stress is prevented from concentrating on and causing fatigue of not only the semiconductor chips but also the solder connections between the chips and lead wires 7, 8 and between the chips and the horizontal portion of the terminal plate 4.

Finally, as the resin 9 is flexible and lies between the base plate 1 and the thermosetting resin 12, the elasticity of the lead wires 7, 8 is used to full advantage. In this way the strain of the insulation plate 3 does not directly influence the semiconductor chips, and the device consistently maintains its characteristics over a long period of time.

What is claimed is

1. A molded resin semiconductor device having a plurality of mutually connected semiconductor chips (5, 6) disposed within a unitary housing, comprising:
   (a) a plurality of lead wires (7, 8) individually soldered to the semiconductor chips,
   (b) a first thermosetting resin (13, 14) surrounding exposed outer surfaces of said semiconductor chips and the lead wire solder connections,
   (c) a flexible resin (9) overlying and surrounding said thermosetting resin (13, 14) and the lead wires, and
   (d) a second thermosetting resin (12) overlying said flexible resin, wherein the thermal expansion coefficient of said first thermosetting resin is smaller than that of said flexible resin, and the thermal conductivity of said first thermosetting resin is greater than that of said flexible resin to reduce thermal stress in the solder connections when the semiconductor chips are subjected to intermittent current flow and to prevent the failure of said connections due to fatigue.

2. A semiconductor device according to claim 1, wherein said semiconductor chips are diodes.

3. A semiconductor device according to claim 1, wherein said flexible resin is gelled silicone and said first thermosetting resin is epoxy resin.

4. A semiconductor device according to claim 3, wherein said first and second thermosetting resins are of the same material.

5. A molded resin semiconductor device, comprising:
   (a) a radiation base plate (1),
   (b) a case (2) fixed at one end to an upper surface of said base plate,
   (c) an insulating plate (3) fixed to the upper surface of said base plate within said case,
   (d) a first terminal plate (4) fixed to an upper surface of said radiation plate within said case,
   (e) first and second semiconductor diodes (5, 6) each having first and second electrodes, each first electrode being connected to the first terminal plate (4),
   (f) first and second elastic lead wires (7, 8) individually connected at one end to the second electrode of said first and second diodes by soldering,
   (g) a first thermosetting resin (13, 14) covering the circumference and upper surface of said first and second diodes and surrounding the solder connections,
   (h) a flexible resin (9) injected into said case and covering said insulating plate, a part of said first terminal plate, said first thermosetting resin, and a part of said first and second lead wires,
   (i) second and third terminal plates (10, 11) individually connected at one end to the other end of said first and second lead wires, and
   (j) a second thermosetting resin (12) overlying said first resin within said case, wherein the thermal expansion coefficient of said first thermosetting resin is smaller than that of said flexible resin, and the thermal conductivity of said first thermosetting resin is greater than that of said flexible resin to reduce thermal stress in the solder connections when the diodes are subjected to intermittent current flow and to prevent the failure of said connections due to fatigue.

6. A semiconductor device according to claim 5, wherein said flexible resin is gelled silicone and said first thermosetting resin is epoxy resin.

7. A semiconductor device according to claim 6, wherein said first and second thermosetting resins are of the same material.

* * * * *